United States Patent [19]

Nakaizumi

[11] Patent Number: 4,985,866
[45] Date of Patent: Jan. 15, 1991

[54] COMPOUND SEMICONDUCTOR MEMORY DEVICE HAVING REDUNDANT CIRCUIT CONFIGURATION

[75] Inventor: Kazuo Nakaizumi, Tokyo, Japan

[73] Assignee: NEC Corporation, Tokyo, Japan

[21] Appl. No.: 385,118

[22] Filed: Jul. 26, 1989

[30] Foreign Application Priority Data

Jul. 26, 1988 [JP] Japan .................. 63-186015

[51] Int. Cl.⁵ .......................................... G11C 13/00
[52] U.S. Cl. .................................. 365/200; 365/95;
365/189.01; 365/96
[58] Field of Search ............ 365/95, 96, 189.01,
365/200, 230.01

[56] References Cited

U.S. PATENT DOCUMENTS 4,885,720 12/1989 Miller et al. .................. 365/200

Primary Examiner—Terrell W. Fears
Attorney, Agent, or Firm—Sughrue, Mion, Zinn, Macpeak & Seas

[57] ABSTRACT

A compound semiconductor memory device having a redundancy configuration is disclosed. A fuse element to reject and replace a defective word line series is formed between a load transistor and a power voltage line in the primary decoder, and the word line is connected to the decoder without fuse element.

10 Claims, 5 Drawing Sheets

COMPOUND SEMICONDUCTOR MEMORY DEVICE HAVING REDUNDANT CIRCUIT CONFIGURATION

BACKGROUND OF THE INVENTION

1. Field of the Invention

The present invention relates to a compound semiconductor memory device, and more particularly, to a compound semiconductor memory device of static random access memory (hereinafter called as SRAM) type having a redundant memory cell section and a redundant decoder.

2. Description of Related Art

Heretofore, in a SRAM device of silicon series, a redundant memory cell section and a redundant decoder of a type in which selected fuses are blown by laser beam have been provided to replace defective memory cells to good ones in the redundant memory cell section thereby enhancing the yield ratio of the device. However, in a conventional compound semiconductor memory device such as of gallium arsenide (GaAs) series, a redundancy configuration is not provided because one suitable for the compound semiconductor memory device has not been developed. Therefore, when one or two defective memory cells are produced in the compound semiconductor memory device of, for example, 4K bits SRAM, the device must be rejected, and therefore, the yield ratio cannot be enhanced.

SUMMARY OF THE INVENTION

Accordingly, one object of the present invention is to provide a compound semiconductor memory device having an effective redundancy configuration to enhance its yield ratio.

Another object of the present invention is to provide an effective compound semiconductor memory device of SRAM type in which each memory cell includes a plurality of compound semiconductor field effect transistors (hereinafter called as MESFET's in plural case, and as MESFET in singular case) having a gate forming Schottky barrier diode, and in which a redundancy configuration is formed.

According to a feature of the present invention, there is provided a compound semiconductor memory device which comprises a primary memory cell section including a plurality of primary memory cells, a redundant memory cell section including a plurality of redundant memory cells, a plurality of primary decoders, at least one redundant decoder, a plurality of primary column lines (primary word lines) each formed in the primary memory cell section, coupled to corresponding the primary memory cells and connected to corresponding the primary decoder, at least one redundant column line (redundant word line) formed in the redundant memory cell section, coupled to corresponding the redundant memory cells and connected to the redundant decoder, and first and second power voltage lines. In the feature, each of the primary decoders includes a NOR gate circuit connected between first and second common lines and inputted address signals, a first transistor connected to the first common line, a first fuse element connected between the first transistor and the first power voltage line so as to form a series connection with the first transistor, a second transistor connected between the first and second common lines and connected to the second power voltage line. Further, the redundant decoder may include a NOR gate circuit having a fuse programmable link means, connected between third and fourth common lines and inputted address signals, a third transistor connected between the third common line and the first power voltage line, and a second fuse element connected between the third and fourth common lines and connected to the second power voltage line. The NOR circuit in the primary decoder may be constituted by a plurality of MESFET's each having source and drain regions connected between the first and second common lines and a gate forming a Schottky barrier diode and inputted an address signal, and the NOR gate circuit in the redundant decoder may be constituted by a plurality of programmable fuse elements as the programmable link means each connected to the fourth common line at its one end, a plurality of MESFET's each having source and drain region and a gate forming a Schottky barrier diode and inputted an address signal, one of the source and drain regions being connected to the other end of the programmable fuse element to form a series connection and the other of the source and drain regions being connected to the third common line. Further, the first transistor in the primary decoder section may be a MESFET having source and drain regions and a gate forming a Schottky barrier diode, one of the source and drain regions being connected to the first fuse element to form a series connection and the other of the source and drain regions and the gate being connected in common to the first common line; the second transistor in the primary decoder section may be a MESFET having source and drain regions and a gate forming a Schottky barrier diode, one of the source and drain regions being connected to the first common line and the other of the source and drain regions and the gate being connected in common to the second power voltage line with the second common line; and the third transistor in the redundant decoder may be a MESFET having source and drain regions and a gate forming a Schottky barrier diode, one of the source and drain regions being connected to the first power voltage line and the other of the source and drain regions and the gate being connected in common to the third common line.

Generally, the first power voltage line supplies a high voltage such as a ground voltage (0 volts) and the second power voltage line supplies a low voltage such as an negative voltage of, for example, −2.0 volts.

The primary column line (primary word line) may be connected to a driver circuit of the primary decoder and the redundant column line (redundant word line) may be connected to a driver circuit in the redundant decoder. In this case, each driver circuit includes an output node connected to the primary column line or the redundant column line, a third power voltage line supplying an negative voltage of, for example, −4.5 volts, a pull-down MESFET connected between the output node and the third power voltage line at its source and drain regions and connected to the third power voltage line at its gate which forms a Schottky barrier diode, a source follower MESFET connected at its drain region to the first power voltage line and at its gate, which forms a Schottky barrier diode, to the first common line of the primary decoder or to the third common line of the redundant decoder, and a level shift diode connected between the source region of the source follower MESFET and the output node. The level shift diode may be formed by a gate Schottky barrier diode of a MESFET between the gate and the source and drain regions which are commonly connected to each other. Or else, the primary column line may be directly connected to the first common line of the primary decoder without the driver circuit, and the redundant column line may be directly connected to the third common line of the redundant decoder without the driver circuit.

Each of the primary and redundant memory cells may include a transfer gate transistor of MESFET which has a pair of source and drain regions and a gate forming a Schottky barrier diode, one of the source and drain regions being coupled to corresponding a row line (bit line) and the gate being coupled to corresponding the primary or redundant column line (word line). The present invention is useful when the memory cell is of SRAM type. However, the transfer gate transistor of MESFET mentioned above may be of DRAM memory cell in which the transfer gate transistor is coupled to a storage capacitor.

DETAILED DESCRIPTION OF THE EMBODIMENTS

Figure 1:
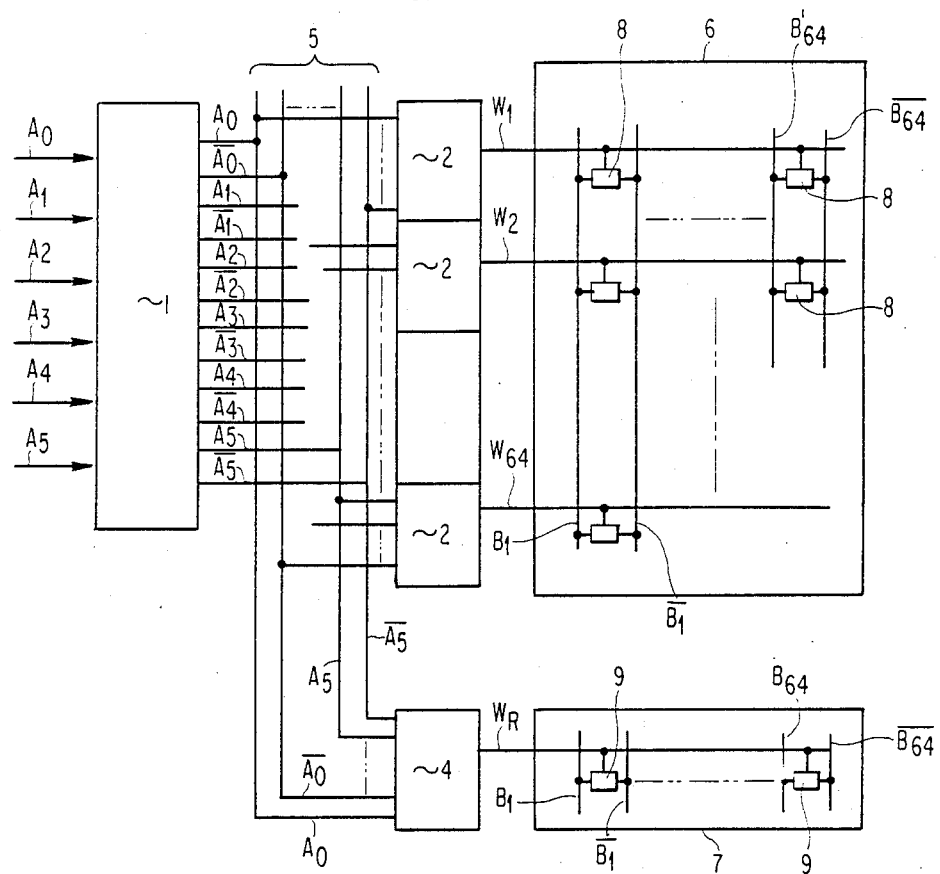
FIG. 1 is a schematic block diagram in which embodiments of the present invention are adapted.

Referring to FIG. 1, six address signals ($A_0$, $A_1$...$A_5$) are inputted in an address buffer section 1, and in turn, twelve address signals ($A_0$, $\overline{A_0}$, ...$A_5$, $\overline{A_5}$) of true and complement are outputted from the buffer section 1 to respective decoder lines 5. Sixty four primary word address decoders 2 are arrayed, and six signals selected from each pair of ($A_k$, $\overline{A_k}$) are inputted from the decoder lines 5 to every decoder 2 under a different combination to each other such that only one decoder and word line W connected thereto is selected in response to one information by the address signals inputted to the buffer section 1. In a primary memory cells section 6, sixty four primary word lines (column lines) $W_j$ (j=1, 2 ... 64) connected to respective primary decoders 2 and sixty four pairs of bit lines (row lines) $B_i$, $\overline{B_i}$, (i=1, 2 .. . 64) are formed, and a plurality (64×64) of primary SRAM memory cells 8 are formed in a matrix arrangement and coupled to corresponding word and bit lines. The twelve decoder lines 5 are connected to a redundant word address decoder 4 to which a redundant word line $W_R$ is connected. In a redundant memory cell section 7, the redundant word line $W_R$ and sixty four pair of bit lines $B_i$, $\overline{B_i}$ (i=1, 2 ... 64) extending from the primary memory cell section 6 are formed, and sixty four redundant SRAM memory cells 9 are coupled to corresponding word and bit lines.

In FIG. 1, a single redundant word line connected to a single redundant decoder is shown. However, two or more redundant word lines connected to respective redundant decoders may be used, if necessary. Further, with respect to the bit lines, the same redundancy technology can be employed. If the primary SRAM cell 8 coupled to the primary word line $W_1$ is defective one, the word line $W_1$ and the primary decoder 2 connected to the line $W_1$ are replaced by the redundant word line $W_R$ and the redundant decoder 4.

Figure 2:
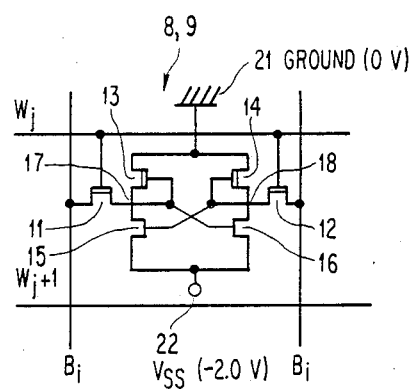
FIG. 2 is a circuit diagram showing a memory cell in the embodiments of the present invention.

Each of the primary and redundant SRAM cells 8, 9 is shown in FIG. 2. The cell includes a pair of load MESFET's 13, 14 of depletion type, a pair of drive MESFET's 15, 16 of enhancement type, and a pair of transfer gate MESFET's 11, 12 of depletion type connected between the bit lines and nodes 17, 18 at their source and drain regions, respectively, and connected to the word line at their gates, respectively.

Figure 3:
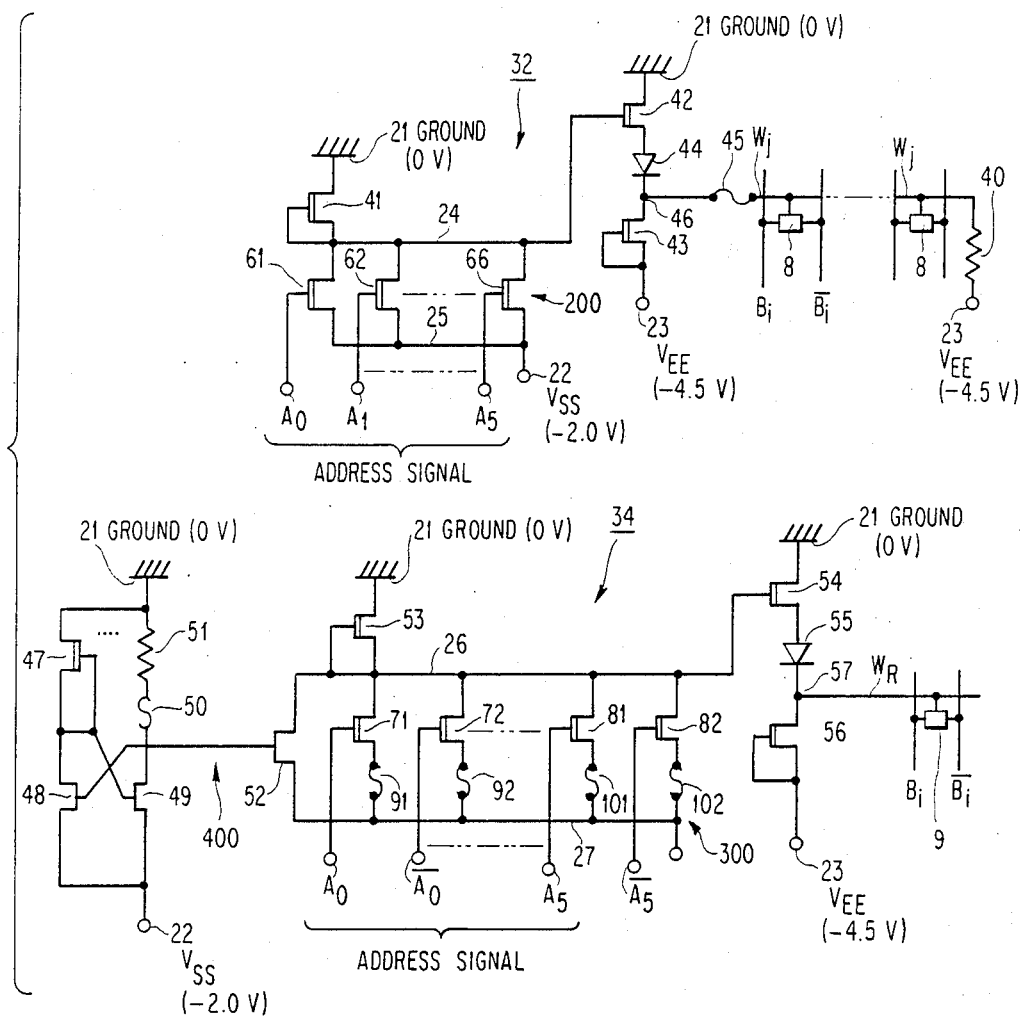
FIG. 3 is a circuit diagram showing a case in which if insulated gate field effect transistors in a conventional silicon memory device would be replaced by MESFET's having gate Schottky diode.

Referring to FIGS. 3, a primary decoder 32 and a redundant decoder 34 which are modified from a conventional silicon memory device by replacing MOSFET's (insulated gate field effect transistors of silicon series) with MESFET's of compound semiconductor having gate Schottky barrier diode.

The primary decoder 32 includes a NOR gate circuit 200 having six MESFET's 61, 62 ... 66 of depletion type connected at their drain regions to a first common line 24, and at their source regions to a second common line 25 to which a negative voltage Vss of $-2.0$ volts is applied from a voltage line 22. Selected six address signals from the decoder lines 5 (FIG. 1) are applied to respective gates. A MESFET 41 of depletion type is connected at its drain to a ground voltage line (0 volt line) 21 and at its source region and gate to the first common line 24. A word driver circuit includes a MESFET 42 connected at its drain to the ground voltage line 21, at its source to an anode of a level shift diode 44 and at its gate to the first common line, a MESFET 43 of depletion type connected at its drain to the cathode of the diode 44 and at its source region and gate to a third power voltage line 23 supplying a negative voltage of $-4.5$ volts, and an output node 46 provided between the diode 44 and the MESFET 43. The primary word line $W_j$ is connected to the output node 46 via a metallic fuse 45. When the primary memory cell 8 coupled to the primary word line $W_j$ is defective one, the metallic fuse 45 is blown by laser beam to cut off from the primary decoder 32. In this case, the transfer gate transistors 11, 12 (FIG. 2) in every memory cells coupled to the cut off word line must be non-conductive state so as to not affect unfavorable action to the bit lines. Therefore, the primary word line is connected to the third power voltage line 23 of $-4.5$ volts through a pull-down resistor 40 having a high resistance of 20 KΩ, to apply the negative voltage of $-4.5$ volts to the gate of the transfer gate MESFET's 11, 12 (FIG. 2) and to render the MESFET's 11, 12 to non-conductive state. However, in this case, the gate Schottky barrier diode of MESFET occurs the breakdown phenomenon; because the breakdown voltage of the diode is about 2.5 volts (reverse voltage) and a negative voltage of $-1.7$ volts is applied from bit lines, and therefore, the voltage difference (reverse voltage) between the anode (gate) of the diode and the cathode (N-type portion of the compound semiconductor (GaAs) under the gate) becomes 2.8 volts (|(−4.5 volts) - (−1.7 volts)) which is higher than the breakdown voltage (2.5 volts). When the breakdown of the diode is produced, the bit lines become unstable state. It is to be noted that if the word line is connected to the second power voltage line of −2.0 volts through the pull-down resistor, the transfer gate transistor cannot be non-conductive state, and that the applicable voltage levels used in a memory device are defined such as 0 volts, −2.0 volts and −4.5 volts.

Consequently, the primary circuit of FIG. 3 modified from a conventional silicon memory device cannot be used in a compound semiconductor memory device.

On the other hand, in the redundant decoder 34, a NOR circuit 300 including twelve MESFET's 71, 72 ... 81, 82 of depletion type and twelve programmable metallic fuses 91, 92 ... 101, 102 as a programmable fuse link and forming every series connection with respective MESFET's 71, 72 ... 81, 82 is provided between third and fourth common lines 26, 27 such that the drain regions of MESFET's 71, 72 ... 81, 82 are connected to the third common line 26; one ends of the programmable metallic fuses 91, 92 ... 101, 102 are connected to the fourth common line 27; and the other ends of the fuses and the source regions of respective MESFET's are connected. Further, twelve address signals of true and complement from the decoder lines 5 (FIG. 1) are sent to the gates of the MESFET's 71, 72, ... 81, 82, respectively. A MESFET 53 of depletion type is connected at its drain region to the first power voltage line 21 of the ground voltage and at its source region and gate to the third common line 26. A control circuit 400 for controlling whether the redundant decoder operates or not is composed of MESFET's 48, 49, 52 of enhancement type, a MESFET 47 of depletion type, a resistor 51 and a metallic fuse 50. As in the primary decoder 32, the redundant decoder has a driver circuit including a source follower MESFET 54 of depletion type connected at its drain to the ground voltage line 21 and at its gate to the third common line 26, a level shift diode connected at its anode to the source region of the MESFET 54, a pull-down MESFET 56 of depletion type connected at its drain region to the cathode of the diode 55 and at its source region and gate to the negative voltage line 23 of −4.5 V, and an output node 57 provided between the diode and the MESFET 56 and connected to the redundant word line $W_R$.

When a primary memory cell 8 coupled to the word line $W_j$ is defective, the metallic fuse 45 is blown as mentioned above. In this case, the metallic fuse 50 is also blown by laser beam so as to operate the decoder function of the redundant decoder, and a programming of the fuse link is conducted so that the same address signals as in the NOR gate circuit 200 connected to the defective word line, can operate in the NOR gate circuit 300 and that the defective primary word line $W_j$ can be replaced by the redundant word line $W_R$. That is, six address signals $A_0$ (true), $\overline{A_1}$ (complement) ... $\overline{A_5}$ (complement) are sent to the primary decoder 32 (which is assumed to be connected to the defective word line), and therefore, metallic fuses 92, 93 (not shown) ... 101 are blown by laser beam, which fuses are connected in series to MESFET 72, 73 (not shown) ... 81 to which gates address signals $\overline{A_0}$ (complement), $A_1$ (true) ... $A_5$ (true) are applied, so that selected address signals $A_0$ (true), $\overline{A_1}$ (complement) ... $\overline{A_5}$ (complement) conduct the decoder operation of the redundant decoder.

In the FIG. 3, however, the control circuit 400 employs many elements 47, 48, 49, 50, 51 and 52. A demand to use as small number of element as possible is more serious in a compound semiconductor memory device than in a silicon memory device, and therefore, the control circuit 400 of the redundant decoder 34 in FIG. 3, which is modified from a silicon memory device, is not suitable for a compound semiconductor memory device.

Figure 4:
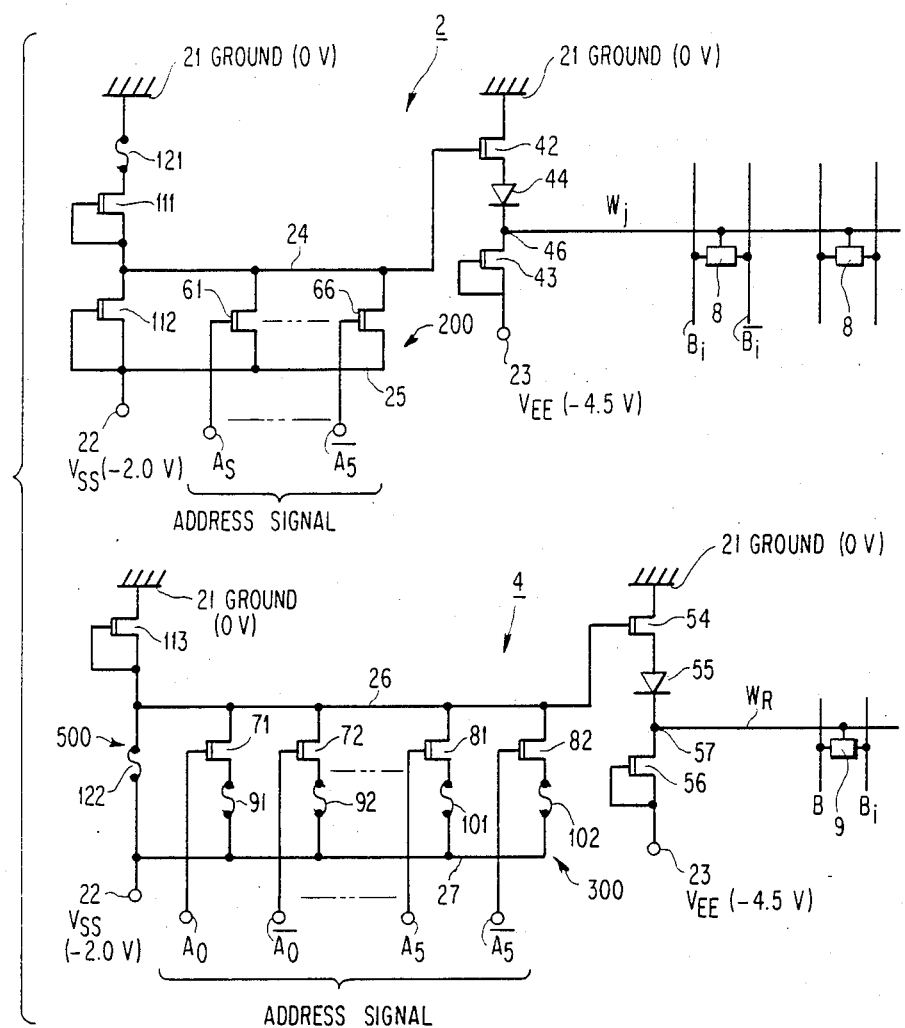
FIG. 4 is a circuit diagram showing a first embodiment of the present invention.

Referring to FIG. 4, a first embodiment of the present invention will be explained. In FIG. 4, the same components as those in FIG. 3 are indicated by the same reference numerals. A primary decoder 2 of the present invention includes a fuse element 121 connected at its one end to the ground line of 0 volts; a first MESFET 111 of depletion type as a load transistor connected at its drain region to the other end of the fuse element 121, and at its source region and at its gate to the first common line 24 in common; and a second MESFET 112 of depletion type having a small current flowing ability of one tenth as compared with the first MESFET 111 and connected at its drain region to the first common line 24, and at its source region and at its gate to the negative voltage line 22 of −2.0 V in common with the second common line 25. On the other hand, the word line $W_j$ is directly connected to the output node 46 of the decoder 2 without fuse element. A redundant decoder 4 of the present embodiment installs a simple control circuit 500 for controlling whether redundancy is to be operated or not. That is, the control circuit 500 includes a third MESFET 113 of depletion type as a load transistor connected at its drain region to the ground line 21 of 0 volts, and at its source region and at its gate to the third common line 26 in common; and a fuse element 122 connected at its one end to the third common line 26 and at its the other end to the negative voltage line 22 of −2.0 volts with the fourth common line 27.

Figure 5A:
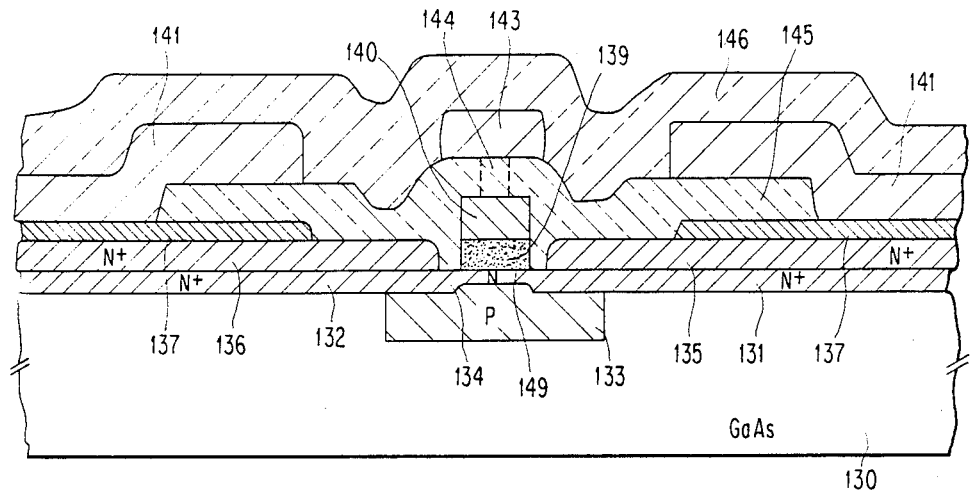
FIG. 5A a cross-sectional view showing a MESFET used in the embodiments of the present invention.

Referring to FIGS. 5A, the MESFET's used in the primary and redundant decoders and the primary and redundant memory cell sections of the present embodiment will be explained. In a major surface of a semi-insulating GaAs compound semiconductor substrate 130, a P-type impurity region 133 and an active layer consisting of N+-type source and drain regions 131, 132 having a high N-type impurity concentration and an N-type region 134 used as a channel portion provided between the source and drain regions and having a low N-type, impurity concentration are formed by ion implantation method, and N+-type contact layers 135, 136 of GaAs having a high impurity concentration are deposited on the source and drain regions 131, 132, respectively. On the N-type region 134 a gate consisting of a tungsten silicide (WSi) portion 139 and a tungsten portion 140 is formed so that a Schottky barrier diode 149 is formed at the surface of the N-type region 134. Electrodes 137 of AuGe-Ni are formed on the contact layers 135, 136, respectively, and source and drain wirings 141 made of a first level gold layer are connected to the electrodes 137, respectively. Also, a gate wiring 143 made of the first level gold layer is connected to the gate via a contact hole 144 formed in an inter-ply insulating layer 145, and an inter-ply insulating layer 146 covers the MESFET entirely The threshold voltage of the MESFET can be controlled by the impurity concentration of the N-type impurity region 134. An enhancement type MESFET can be obtained by forming the depth of the region 134 to be shallower than that of a depletion type MESFET.

Figure 5B:
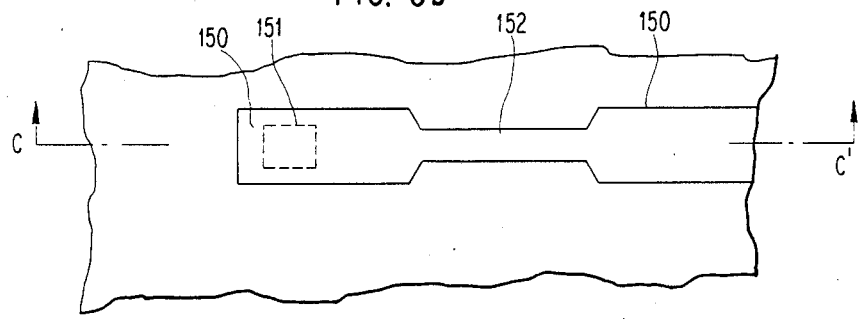
FIG. 5B is a plan view showing a fuse element used in the embodiments of the present invention.
Figure 5C:
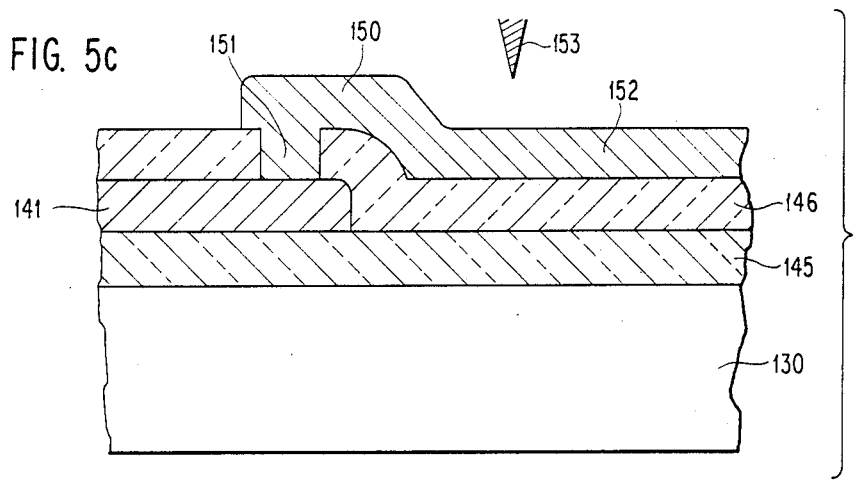
FIG. 5C is a cross-sectional view taken along line C—C' in FIG. 5B as viewed in the direction of arrows.

Referring to FIGS. 5B and 5C, the fuse elements used in the primary and redundant decoders of the present embodiment will be explained. A wiring 150 made of a second level gold layer is connected to the source or drain wiring 141 through a contact hole 151 formed in the inter-ply insulating layer 146, and extending on the layer 146. The wiring 150 has a narrow part 152 used as the fuse element on the insulating layer 146, and when the fuse element is to be cut-off, a laser beam 153 is irradiated for blowing a section of the narrow part 152.

Figure 6:
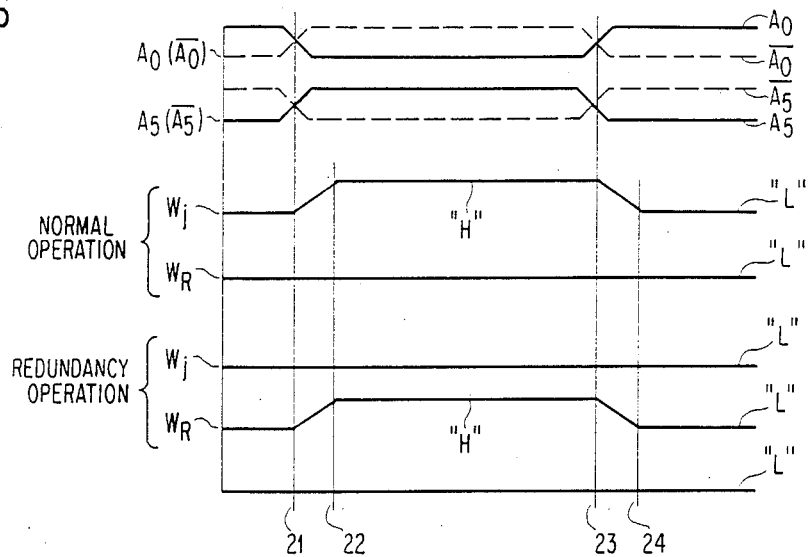
FIG. 6 is a timing chart showing the voltage levels of the signals in FIG. 4.

Next, operations of the first embodiment will be explained by referring FIGS. 4 and 6.

In a normal operation (the fuse element 121 is not cut off), during a period ($t_{21}$ to $t_{23}$ in FIG. 6) when all of six address signals $A_0 \ldots \overline{A_5}$ are "L" state, the MESFET 42 becomes conductive so that the word line $W_j$ renders "H" state (selective state during $t_{22}$ to $t_{23}$ in FIG. 6) in which the transfer gate MESFET's 11, 12 in the memory cell 8 (FIG. 2) become conductive; and when one or more of six address signals $A_0 \ldots \overline{A_5}$ is "H" state (before $t_{21}$ and after $t_{23}$ in FIG. 6), the word line $W_j$ renders "L" state (non-selective state) (before $t_{21}$ and after $t_{24}$ in FIG. 6) in which transfer gate MESFET's become non-conductive. The redundant word line $W_R$ keeps "L" state during all the time.

On the other hand, if the memory cell 8 coupled to the word line $W_j$ is defective one or the word line per se is defective, the fuse element 121 is blown by laser beam, and therefore, the common line keeps a low-voltage state, and the word line $W_j$ keeps "L" state in all the time (FIG. 6) irrespective of the address signals $A_0 \ldots A_0$ applied to the NOR gate circuit 200 of the primary decoder 2. The low voltage of "L" state in the word line $W_j$ is applied from the node 46 of the drive circuit in the primary decoder 2, and its level is $-3.2$ volts which level can render every transfer gate MESFET coupled to the defective word line $W_j$ at their gate non-conductive, and which level does not cause the unfavorable breakdown phenomenon of the Schottky barrier diode mentioned above because the voltage difference (reverse voltage) between the anode (gate) and the cathode (N-type GaAs region) of the diode becomes 1.5 volts ($|(-3.2) - (-1.7)|$) which is lower than the breakdown voltage (2.5 volts) of the diode.

The primary decoder and the primary word line cannot be used and must be replaced by the redundant decoder 4 and the redundant word line $W_R$. Therefore, the fuse element 122 in the control circuit 500 of the redundant decoder 4 is blown by laser beam so that the redundancy function can be conducted, that is, the voltage in the third common line 26 connected to the gate of the source follower MESFET 54 of the driver circuit can be changed its binary state ("H" state and "L" state) in response to the address signals, and among the twelve programmable fuse elements 91, 92 . . . 101, 102 in the NOR gate circuit 300, necessary six fuse elements 92 . . . 101 are blown off by laser beam so that the redundant decoder 4 can be operated by the same address signals ($A_0, \ldots \overline{A_5}$) as that inputting the NOR gate circuit 200 of the primary decoder 2 connecting the failure word line series. As shown in FIG. 6, the binary state of the redundant word line $W_R$ in the redundancy operation is the same as that of the primary word line $W_j$ in the normal operation.

Figure 7:
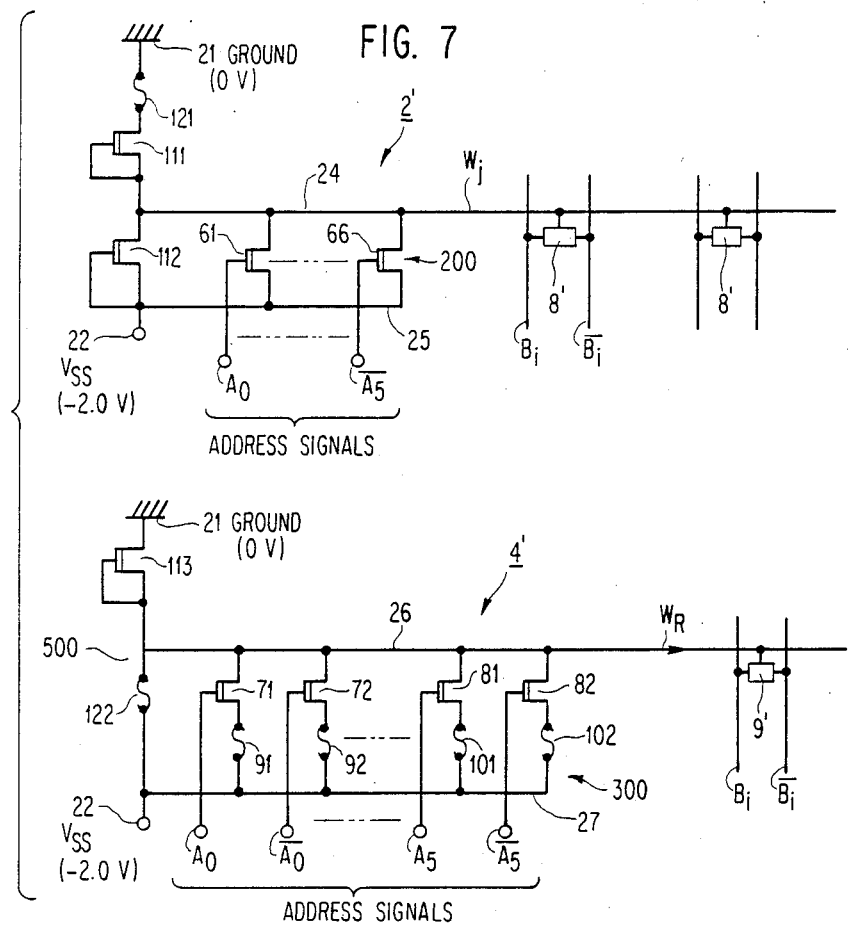
FIGS. 7 is a circuit diagram showing a second embodiment of the present invention.

FIG. 7 shows a second embodiment of the present invention. In FIG. 7, the same component as those in FIG. 4 are indicated by the same reference numerals. The primary decoder 2' of the second embodiment omits to form the level shift circuit (drive circuit) in the first embodiment including the MESFET's 42, 43 and the diode 44 in the primary decoder 2 (FIG. 4), and the primary word line $W_j$ is directly connected to the first common line 24, and also, the redundant decoder 4' omits to form the level shift circuit including the MESFET's 54, 56 and the diode 55 in the redundant decoder 4 (FIG. 4), and the redundant word line $W_R$ is directly connected to the third common line 26. Therefore, the binary levels in the primary and redundant word lines are raised by the $V_f$ (forward voltage) of the diode. Consequently, the second embodiment is useful when the primary and redundant memory cells 8', 9' employ MESFET's having a high threshold voltage or an enhancement type, as their transfer gate transistors.

What is claimed is:

1. A compound semiconductor memory device comprising;
   a primary memory cell section including a plurality of primary memory cells;
   a redundant memory cell section including a plurality of redundant memory cells;
   a plurality of primary decoders;
   at least one redundant decoder;
   a plurality of primary column lines each formed in said primary memory cell section, coupled to corresponding said primary memory cells and connected to corresponding said primary decoder;
   at least one redundant column line formed in said redundant memory cell section, coupled to corresponding said redundant memory cells and connected to said redundant decoder; and
   first and second power voltage lines;
   each of said primary decoders including a NOR gate circuit connected between first and second common lines and inputted address signals, a first transistor connected to said first common line, a first fuse element connected between said first transistor and said first power voltage line so as to form a series connection with said first transistor, a second transistor connected between said first and second common lines and connected to said second power voltage line.

2. A compound semiconductor memory device of claim 1, in which said redundant decoder includes a NOR gate circuit having a fuse programmable link means, connected between third and fourth common lines and inputted address signals, a third transistor connected between said third common line and said first power voltage line, and a second fuse element connected between said third and fourth common line and connected to said second power voltage line with said fourth common line.

3. A compound semiconductor memory device of claim 2, in which said NOR gate circuit in said primary decoder is constituted by a plurality of compound semiconductor field effect transistors each having source and drain regions connected between said first and second common lines, and a gate forming a Schottky barrier diode and inputted an address signal; said NOR gate circuit in said redundant decoder is constituted by a plurality of programmable fuse elements as said programmable link means, each programmable fuse element being connected to said fourth common line at its one end, a plurality of compound semiconductor field effect transistors each having source and drain region, and a gate forming a Schottky barrier diode and inputted an address signal, one of said source and drain regions being connected to the other end of said programmable fuse element to from a series connection, and the other of said source and drain regions being connected to said third common line; said first transistor in said primary decoder section is a compound semiconductor field effect transistor having source and drain regions and a gate forming a Schottky barrier diode, one of said source and drain regions being connected to said first fuse element to form a series connection and the other of said source and drain regions and said gate being connected in common to said first common line; said second transistor in said primary decoder section is a compound semiconductor field effect transistor having source and drain regions and a gate forming a Schottky barrier diode, one of said source and drain regions being connected to said first common line and the other of said source and drain regions and said gate being connected in common to said second power voltage line with said second common line; and said third transistor in said redundant decoder is a compound semiconductor field effect transistor having source and drain regions and a gate forming a Schottky barrier diode, one of said source and drain regions being connected to said first power voltage line and the other of said source and drain regions and said gate being connected in common to said third common line.

4. A compound semiconductor memory device of claim 1, in which said first power voltage line supplies a high voltage, and said second power voltage line supplies a low voltage.

5. A compound semiconductor memory device of claim 4, in which said high voltage is a ground voltage, and said low voltage is a negative voltage.

6. A compound memory device of claim 3 further comprising a plurality of primary column line driver circuits each installed in each of said primary decoders, and a redundant column line driver circuit installed in said redundant decoder.

7. A compound memory device of claim 6, in which said primary column line driver circuit includes a series connection of a fourth transistor, a first diode and a fifth transistor connected between said first power voltage line and a third power voltage line and a first output node provided between said first diode and fifth transistor and connected to corresponding said primary column line, and said redundant column line driver circuit includes a series connection of a sixth transistor, a second diode and a seventh transistor and a second output node provided between said second diode and said seventh transistor and connected to said redundant column line, said fourth transistor being a compound semiconductor field effect transistor and having source and drain regions connected between said first power voltage line and said first diode, and a gate forming a Schottky barrier diode and connected to said first common line, said fifth transistor being a compound semiconductor field effect transistor having source and drain regions connected between said first output node and said third power voltage line, and a gate forming a Schottky barrier diode and connected to said third power supply voltage line, said sixth transistor being a compound semiconductor field effect transistor having source and drain regions connected between said first power voltage supply line and said second diode, and a gate forming a Schottky barrier diode and connected to said third common line, and said seventh transistor being a compound field effect transistor having source and drain regions connected between said second output node and said third power voltage line, and a gate forming a Schottky barrier diode and connected to said third power voltage line.

8. A compound memory device of claim 2, in which each of said primary column lines is directly connected to said first common line of corresponding said primary decoder, and said redundant column line is directly connected to said third common line of said redundant decoder.

9. A compound memory device of claim 1, in which each of said primary memory cells includes a transfer gate transistor of compound semiconductor field effect transistor which has a pair of source and drain regions and a gate forming a Schottky barrier diode, one of said source and drain regions being coupled to corresponding a row line and said gate being coupled to corresponding said primary column line, and each of said redundant memory cells includes a transfer gate transistor of compound semiconductor field effect transistor which has a pair of source and drain regions and a gate forming a Schottky barrier diode, one of said source and drain regions being coupled to corresponding a row line and said gate being coupled to said redundant column line.

10. A compound memory device of claim 9, in which said primary and redundant memory cells are of static random access memory type.

* * * * *

UNITED STATES PATENT AND TRADEMARK OFFICE
CERTIFICATE OF CORRECTION

PATENT NO. : 4,985,866

DATED : January 15, 1991

INVENTOR(S) : Kazuo Nakaizumi

It is certified that error appears in the above-identified patent and that said Letters Patent is hereby corrected as shown below:

Col. 3, line 52, after "$(A_k, \overline{A_k})$" insert --$(k=0 \ldots 5)$--

Col. 5, line 1, delete "(-1.7 volts))" and insert --(-1.7 volts)|)--

Col. 6, line 1, delete "element" and insert --elements--

Col. 7, line 30, delete "$A_o$" and insert --$\overline{A_o}$--

Signed and Sealed this

Twenty-eighth Day of July, 1992

*Attest:*

DOUGLAS B. COMER

*Attesting Officer*   *Acting Commissioner of Patents and Trademarks*